United States Patent
Tsurumi et al.

(10) Patent No.: US 12,234,942 B2
(45) Date of Patent: Feb. 25, 2025

(54) STAND FOR ELECTRONIC DEVICE AND ELECTRONIC DEVICE ASSEMBLY

(71) Applicant: Sony Interactive Entertainment Inc., Tokyo (JP)

(72) Inventors: Hiroaki Tsurumi, Tokyo (JP); Sei Oonishi, Tokyo (JP); Keiko Sato, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 176 days.

(21) Appl. No.: 17/998,071

(22) PCT Filed: May 11, 2021

(86) PCT No.: PCT/JP2021/017927
§ 371 (c)(1),
(2) Date: Nov. 7, 2022

(87) PCT Pub. No.: WO2021/230246
PCT Pub. Date: Nov. 18, 2021

(65) Prior Publication Data
US 2023/0175640 A1 Jun. 8, 2023

(30) Foreign Application Priority Data
May 15, 2020 (JP) ................. 2020-086210

(51) Int. Cl.
*H05K 5/02* (2006.01)
*F16M 11/04* (2006.01)
*F16M 11/22* (2006.01)

(52) U.S. Cl.
CPC .......... *F16M 11/22* (2013.01); *F16M 11/041* (2013.01); *H05K 5/0234* (2013.01); *F16M 2200/068* (2013.01); *F16M 2200/08* (2013.01)

(58) Field of Classification Search
CPC ... H05K 5/0017; H05K 5/0217; H05K 5/0234
(Continued)

(56) References Cited

U.S. PATENT DOCUMENTS 6,785,567 B2    8/2004   Kato
9,105,296 B2    8/2015   Sogabe
(Continued)

FOREIGN PATENT DOCUMENTS

CN    202452046 U    9/2012
CN    210053443 U    2/2020
(Continued)

OTHER PUBLICATIONS

International Search Report for corresponding PCT Application No. PCT/JP2021/017927, 5 pages, dated Jul. 13, 2021.
(Continued)

*Primary Examiner* — Hung S. Bui
(74) *Attorney, Agent, or Firm* — Kilpatrick Townsend & Stockton LLP

(57) ABSTRACT

Provided is a stand capable of supporting an electronic device and improving the degree of freedom in appearance of the electronic device. A stand (1) is a stand for supporting an electronic device (90) having a lower exterior panel (92B) with a curved lower surface. The stand (1) has a stand main body (B) that is located, in plan view, inside an outer circumferential edge of the lower exterior panel (92B) and that has supporting surfaces (11a and 11b) to make contact with the lower surface. Also, the stand (1) has an arm (27) that extends from the stand main body (B) toward the outer circumferential edge of the lower exterior panel (92B) of the electronic device (90) and that has engagement sections (27A and 27B) to engage with an exterior member of the electronic device (90).

14 Claims, 13 Drawing Sheets

(58) Field of Classification Search
USPC ....... 361/807, 728, 730, 752, 796, 800, 809, 361/810
See application file for complete search history.

(56) References Cited

U.S. PATENT DOCUMENTS

| | | | |
|---|---|---|---|
| 11,626,686 B2* | 4/2023 | Telesco | ................... H04M 1/04 |
| | | | 439/352 |
| 2003/0083115 A1 | 5/2003 | Kato | |
| 2004/0233631 A1* | 11/2004 | Lord | ..................... G06F 1/1632 |
| | | | 361/679.41 |
| 2009/0179131 A1 | 7/2009 | Lord | |
| 2014/0364047 A1 | 12/2014 | Inoue | |
| 2015/0082327 A1 | 3/2015 | Sogabe | |
| 2015/0124398 A1* | 5/2015 | Kirkpatrick | ........ H05K 7/20136 |
| | | | 361/679.48 |
| 2017/0135234 A1* | 5/2017 | Kim | ........................ E05D 3/022 |
| 2019/0038018 A1 | 2/2019 | Hill | |
| 2021/0191461 A1* | 6/2021 | Jaggers | ................... G06F 1/206 |

FOREIGN PATENT DOCUMENTS

| | | |
|---|---|---|
| JP | 2003134209 A | 5/2003 |
| JP | 2008228826 A | 10/2008 |
| JP | 2009059791 A | 3/2009 |
| WO | 2013154041 A1 | 10/2013 |

OTHER PUBLICATIONS

Extended European Search Report for corresponding EP Application No. 21803020.3, 10 pages, dated May 14, 2024.
Phone Battles, "PS5 How to Attach Stand (Horizonatl and Vertical)," https://www.youtube.com/watch?v=uFEjbjFVfOE, 2 pages, dated Nov. 12, 2020 (for relevancy, see Non-Pat. Lit. #1).

* cited by examiner

STAND FOR ELECTRONIC DEVICE AND ELECTRONIC DEVICE ASSEMBLY

TECHNICAL FIELD

The present invention relates to a stand for supporting an electronic device.

BACKGROUND ART

An electronic device used as a home gaming machine is disclosed in PTL 1 listed below. A housing of the electronic device has an upper portion having an elliptical cross section and a box-shaped lower portion. The upper portion of the electronic device has a curved upper surface. When the electronic device is arranged in a horizontal posture (posture in which the device is horizontally longer), a bottom surface of the box-shaped lower portion is in contact with an installation surface.

A stand for supporting an electronic device is disclosed in PTL 2 listed below. When the electronic device is in a vertical posture (posture in which the device is vertically longer), a side surface of the electronic device comes on the lower side. The stand is attached to the side surface of the electronic device.

CITATION LIST

Patent Literature

[PTL 1] PCT Patent Publication No. WO2013/154041
[PTL 2] U.S. Patent Application Publication No. 2014/0364047

SUMMARY

Technical Problem

Even in a case where an outer surface of an electronic device is curved to improve an appearance of the electronic device, it has been necessary to flatten a bottom surface of the electronic device to stabilize a posture of the electronic device, for example, as disclosed in PTL 1. Existence of such a flat surface leads to a reduced degree of freedom in appearance of the electronic device.

Solution to Problem

A stand proposed in the present disclosure is a stand for supporting an electronic device having a curved first exterior surface. The stand includes a stand main body that is located in plan view inside an outer circumferential edge of the first exterior surface and that has a first supporting surface to make contact with the first exterior surface, and an arm that extends from the stand main body toward the outer circumferential edge of the first exterior surface of the electronic device and that has an engagement section to engage with an exterior member of the electronic device. According to this stand, it is possible to support the electronic device and improve the degree of freedom in appearance of the electronic device.

An electronic device assembly proposed in the present disclosure has an electronic device having a curved first exterior surface and a stand for supporting the electronic device. The stand has a stand main body that is located in plan view inside an outer circumferential edge of the first exterior surface and that has a first supporting surface to make contact with the first exterior surface, and an arm that extends from the stand main body toward the outer circumferential edge of the first exterior surface of the electronic device and that has an engagement section to engage with an exterior member of the electronic device. According to this electronic device assembly, it is possible to support the electronic device and improve the degree of freedom in appearance of the electronic device.

DESCRIPTION OF EMBODIMENT

A description will be given below of a stand proposed in the present disclosure and an electronic device assembly that includes the stand and an electronic device. In the description given below, directions indicated by Y1 and Y2 in FIG. 1 will be referred to as forward and backward, respectively, and directions indicated by Z1 and Z2 in FIG. 1 will be referred to as upward and downward, respectively. Also, directions indicated by X1 and X2 in FIG. 1 will be referred to as rightward and leftward, respectively.

A description will be given first of an electronic device 90 illustrated in FIGS. 10A and 10B as an example of the electronic device supported by the stand. The electronic device 90 is, for example, an entertainment device that functions as a gaming device or an audio/visual device. The electronic device 90 outputs moving image data generated by executing a game program, video/audio data acquired through a network, and video/audio data acquired from a recording medium such as an optical disc to a display device such as a television set. An electronic device may be, for example, a personal computer.

Figure 10A:
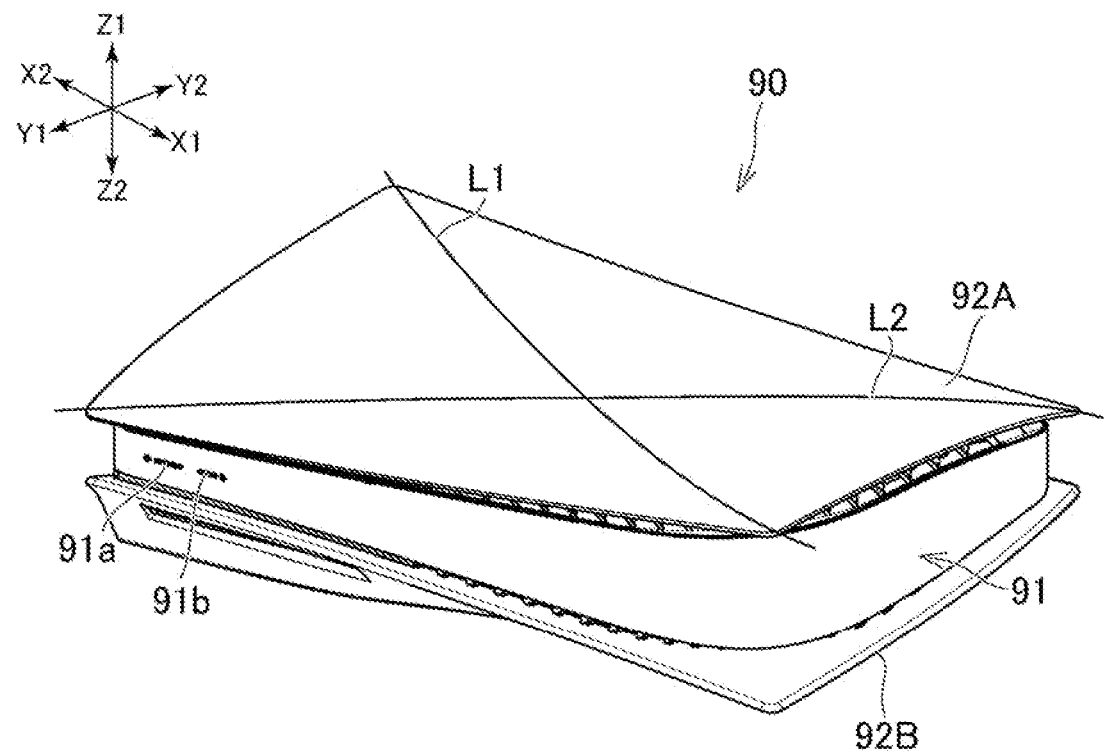
FIG. 10A is a perspective view illustrating the electronic device illustrated in FIG. 1.
Figure 10B:
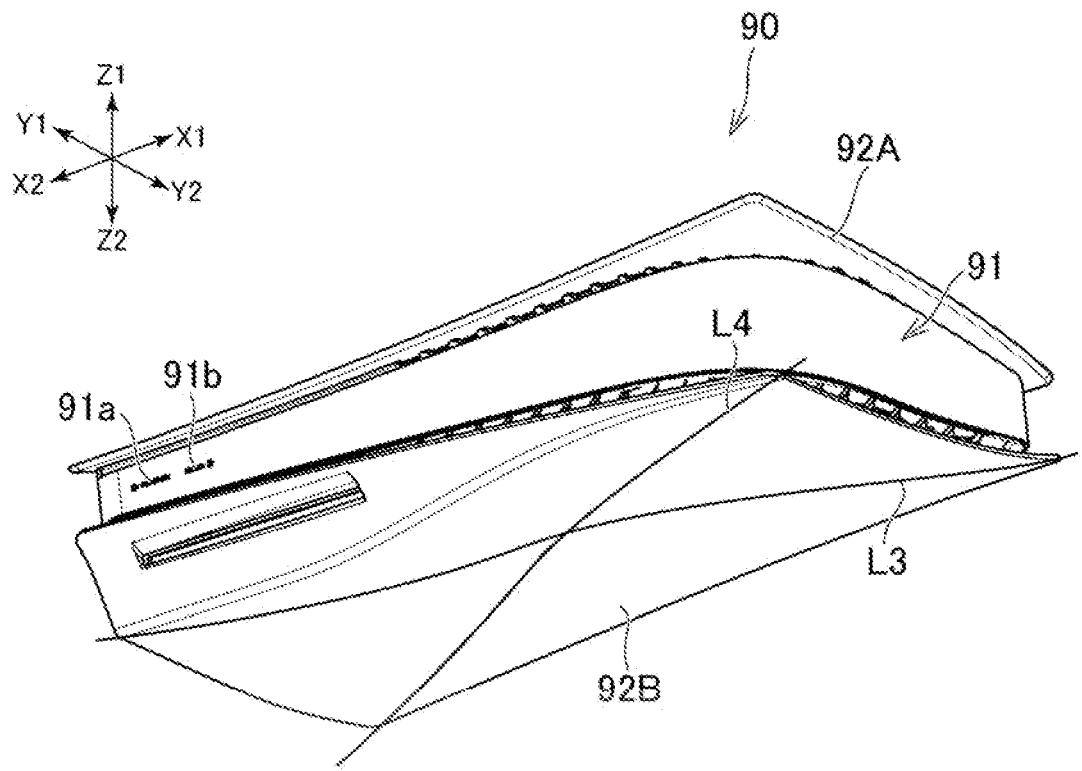
FIG. 10B is a perspective view illustrating the electronic device illustrated in FIG. 1.

As illustrated in FIGS. 10A and 10B, the electronic device 90 has a device main body 91, an upper exterior panel 92A that covers an upper side of the device main body 91, and a lower exterior panel 92B that covers a lower side of the device main body 91. The device main body 91 is box-shaped and accommodates a circuit board, a heat radiation device, and the like therein. The device main body 91 may have a power button 91a and an optical disc ejection button 91b on its front surface. Further, the device main body 91 may have connectors 91d to 91h and an exhaust port H (refer to FIG. 4) on its back surface.

The upper exterior panel 92A is attached to an upper surface of the device main body 90, and the lower exterior panel 92B is attached to a lower surface of the device main body 91. The exterior panels 92A and 92B include, for example, resin such as acrylonitrile butadiene styrene (ABS) or polycarbonate.

As illustrated in FIGS. 10A and 10B, the upper exterior panel 92A and the lower exterior panel 92B have curved exterior surfaces. For example, the upper surface (exterior surface) of the upper exterior panel 92A is a curved surface that continues from a right edge to a left edge thereof and from a front edge to a back edge thereof. The upper surface of the upper exterior panel 92A is curved in such a manner as to swell downward on a cross section along a line L1 and is curved in such a manner as to swell upward on a cross section along another line L2. (In FIG. 10A, the lines L1 and L2 are diagonals of the upper exterior panel 92A.) The lower surface (exterior surface) of the lower exterior panel 92B is a curved surface that continues from a right edge to a left edge thereof and from a front edge to a back edge thereof as with the upper surface of the upper exterior panel 92A. The lower surface (exterior surface) of the lower exterior panel 92B is curved, for example, in such a manner as to swell downward partially or in its entirety on a cross section along a line L3 and is curved in such a manner as to swell upward partially or in its entirety on a cross section along another line L4. (In FIG. 10B, the lines L3 and L4 are diagonals of the lower exterior panel 92B.)

Thus, the upper surface of the upper exterior panel 92A is curved in different manners when the cross sections along two different straight lines are seen. Similarly, the lower surface of the lower exterior panel 92B is curved in different manners when the cross sections along two different straight lines are seen. It should be noted that forms of the curved surface are not limited to those in the example of the electronic device 90. For example, the upper surface of the upper exterior panel 92A and the lower surface of the lower exterior panel 92B may be part of an outer surface of a cylinder or an elliptic cylinder or part of an outer surface of an ellipsoid.

Figure 6:
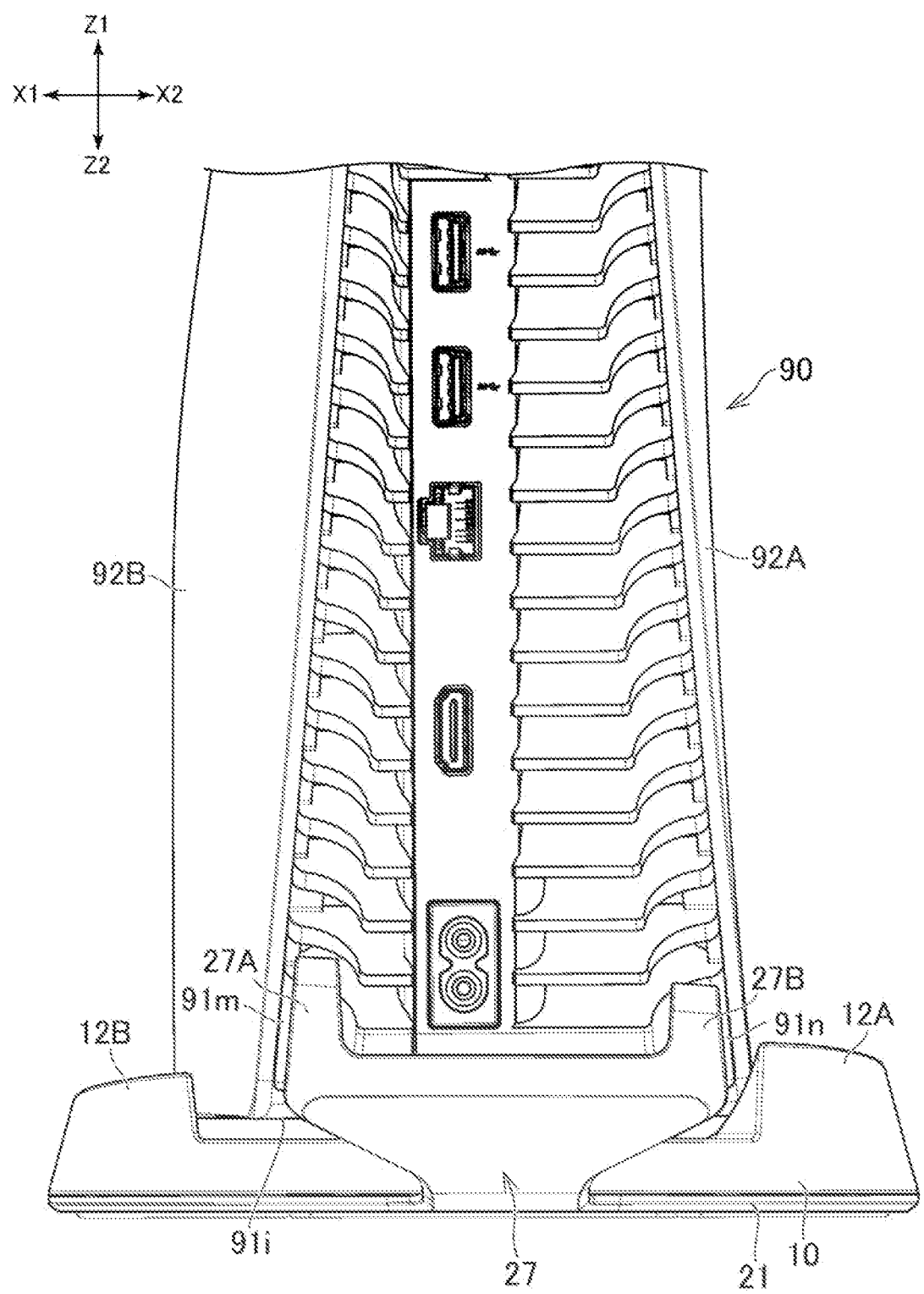
FIG. 6 is a back view of the stand attached to the electronic device in the vertical posture.

The electronic device 90 is a device that is assumed to be installed in a posture in which the lower surface of the lower exterior panel 92B comes on the lower side (horizontal posture; refer to FIG. 4) and in a posture in which a left side surface 91i of the device main body 91 comes on the lower side (vertical posture; FIG. 6). A stand 1 proposed in the present disclosure can be attached to the electronic device 90 in the horizontal posture and can also be attached to the electronic device 90 in the vertical posture. When the electronic device 90 is in the vertical posture, the upper surface (exterior surface) of the upper exterior panel 92A and the lower surface (exterior surface) of the lower exterior panel 92B described above are exposed on left and right sides of the electronic device.

Figure 1:
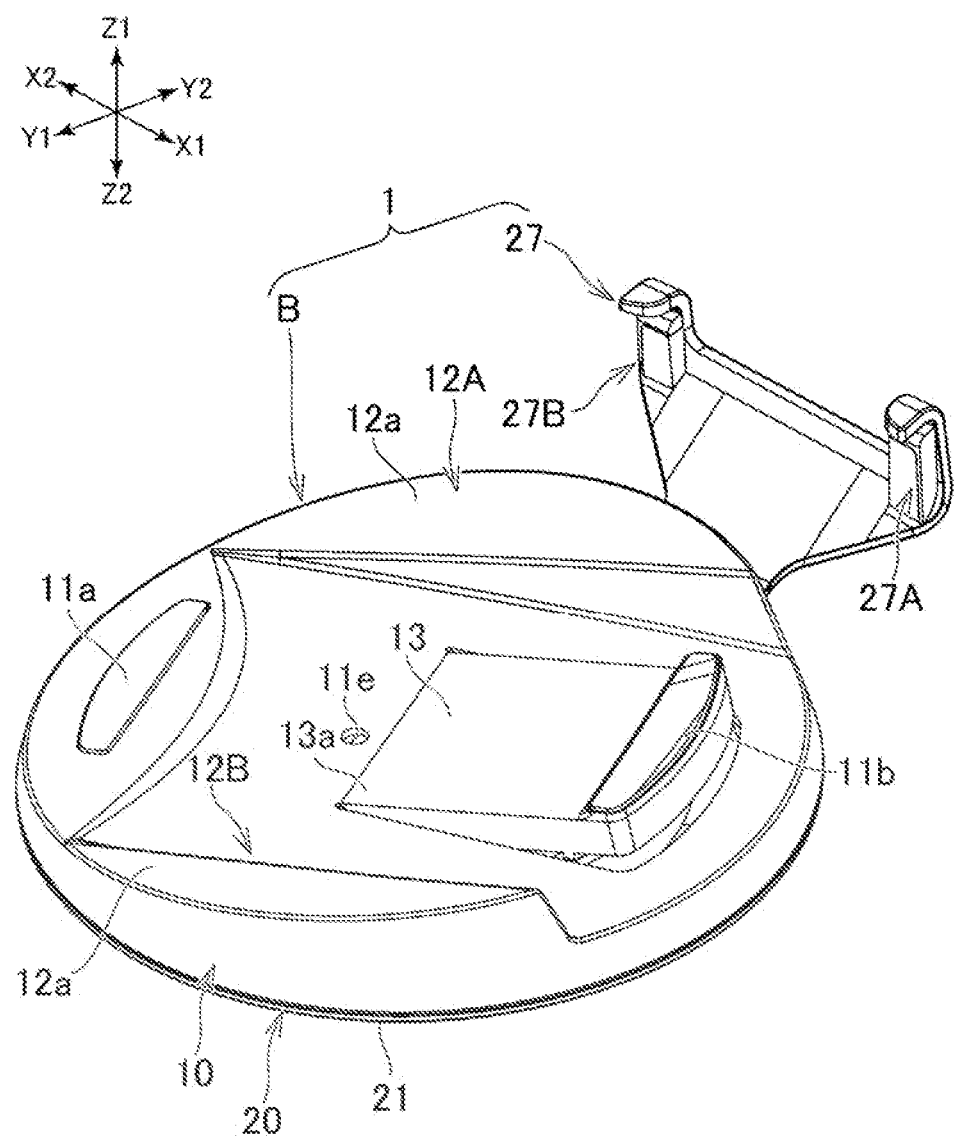
FIG. 1 is a perspective view illustrating an example of a stand proposed in the present disclosure. In this diagram, the stand is in a state for supporting an electronic device in a horizontal posture (horizontal supporting state).
Figure 7:
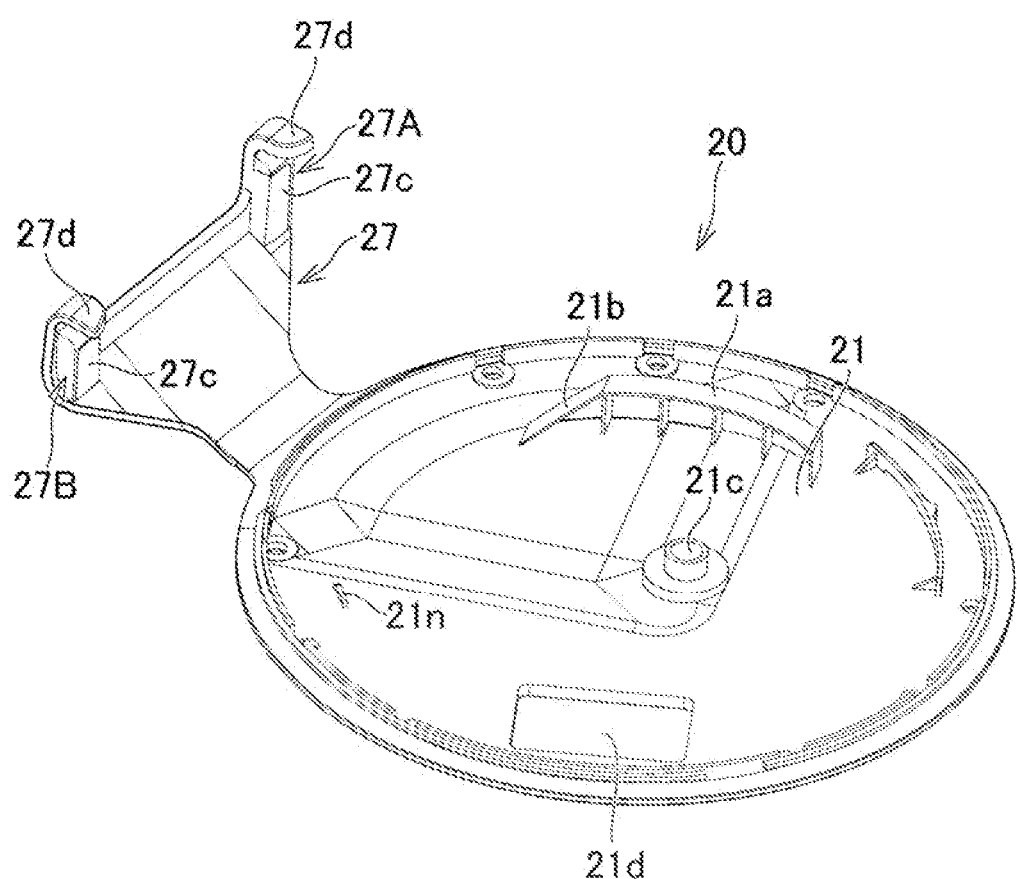
FIG. 7 is a perspective view illustrating a lower member of the stand.

As illustrated in FIG. 1, the stand 1 has a stand main body B and an arm 27 including engagement sections 27A and 27B that engage with an exterior member of the electronic device 90. The stand 1 has an upper member 10 and a lower member 20 (refer to FIG. 7) that are assembled together in an up-down direction. As illustrated in FIG. 7, the lower member 20 has a bottom portion 21 and the arm 27. The bottom portion 21 is assembled together in the up-down direction with the upper member 10. The arm 27 extends from the bottom portion 21.

Figure 5:
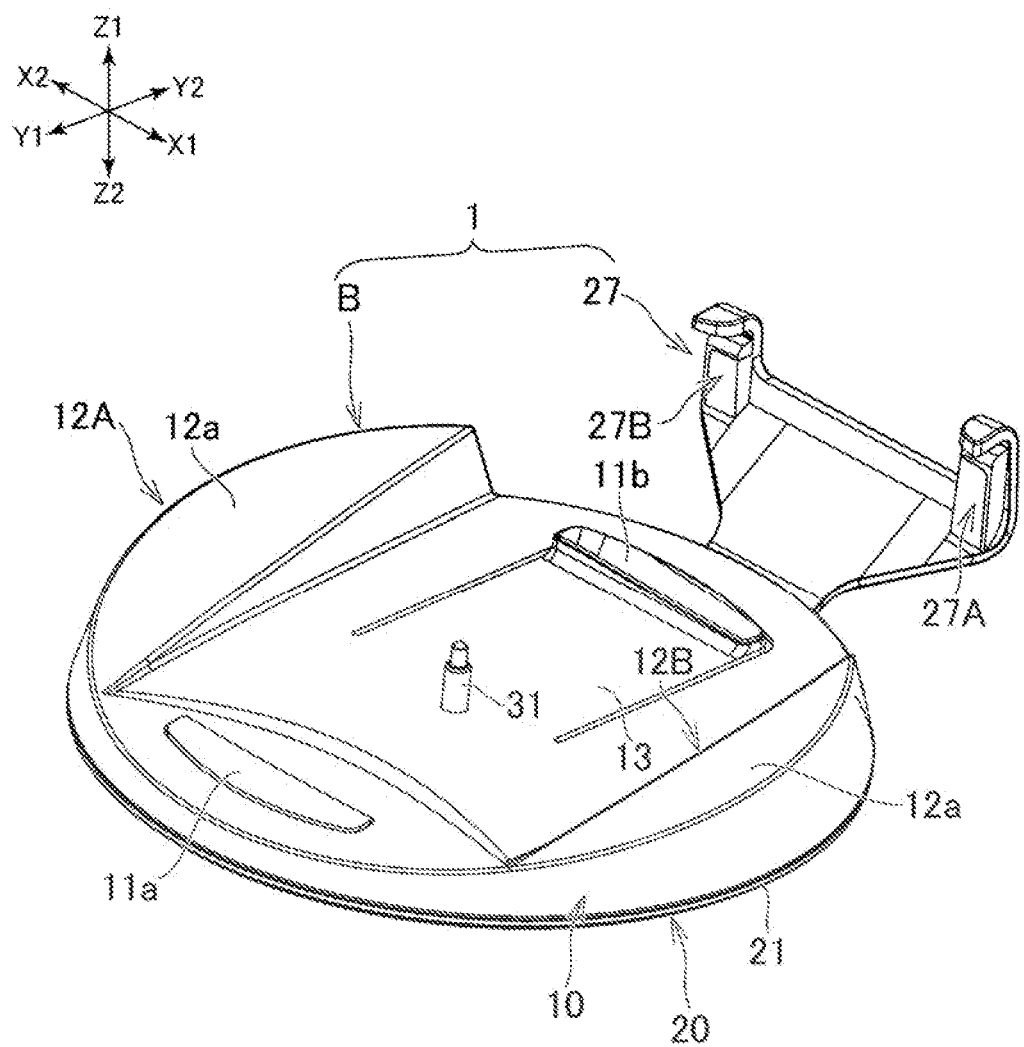
FIG. 5 is a perspective view of the stand illustrated in FIG. 1. In this diagram, the stand is in a state for supporting the electronic device in a vertical posture (vertical supporting state).

The stand 1 can be set to a horizontal supporting state illustrated in FIG. 1 and a vertical supporting state illustrated in FIG. 5. The bottom portion 21 of the lower member 20 and the upper member 10 are rotatable relative to each other. Relative positions of the lower member 20 and the upper member 10 are different between the horizontal supporting state and the vertical supporting state. When the stand 1 is in the horizontal supporting state, the relative positions of the lower member 20 and the upper member 10 are set in such a manner as to be able to support the electronic device 90 in the horizontal posture. When the stand 1 is in the vertical supporting state, the relative positions of the lower member 20 and the upper member 10 are set in such a manner as to be able to support the electronic device 90 in the vertical posture. In the description given below, the relative positions of the lower member 20 and the upper member 10 when the stand 1 is in the horizontal supporting state illustrated in FIG. 1 will be referred to as "horizontal supporting positions," and the relative positions of the lower member 20 and the upper member 10 when the stand 1 is in the vertical supporting state illustrated in FIG. 5 will be referred to as "vertical supporting positions." Relative movements of the lower member 20 and the upper member 10 will be described in detail later.

Figure 3:
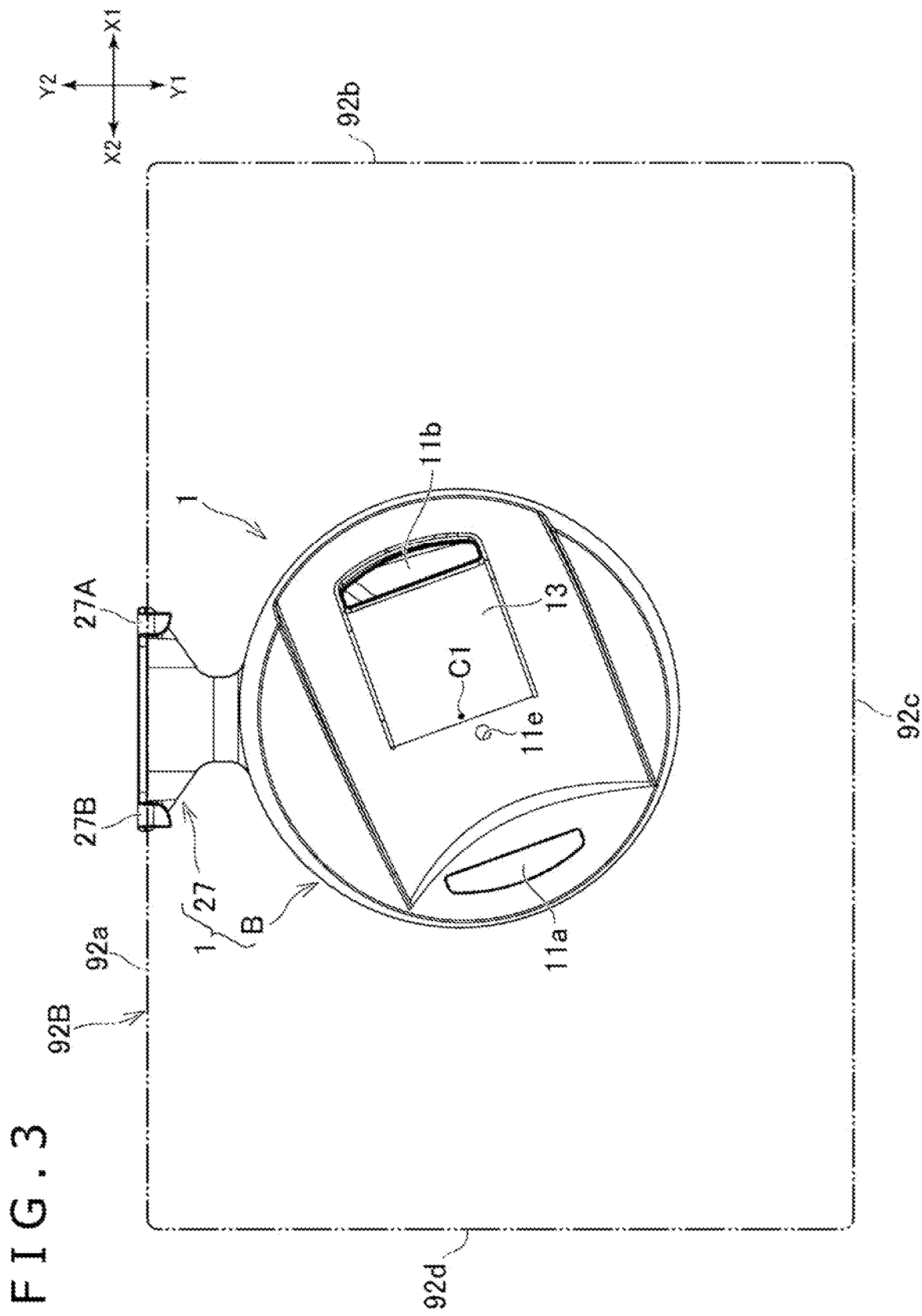
FIG. 3 is a plan view of the stand.

As illustrated in FIG. 3, when the electronic device 90 and the stand 1 are seen in plan view, the stand main body B is located inside outer circumferential edges 92a to 92d of the lower exterior panel 92B of the electronic device 90. That is, a size of the stand main body B is set in such a manner that an entire outer circumferential edge of the stand main body B is separated inward from the outer circumferential edges 92a to 92d of the lower exterior panel 92B. By setting the size of the stand main body B in this manner, it is possible to prevent the stand main body B from standing out and improve an appearance of the electronic device 90 when the electronic device 90 is arranged in the horizontal posture.

The size of the stand main body B in a left-right direction may be, for example, smaller than ⅔ of the size of the electronic device 90 in the left-right direction. Also, the size of the stand main body B in a front-back direction may be, for example, smaller than ⅔ of the size of the electronic device 90 in the front-back direction. The size of the stand main body B in the left-right direction may be, for example, smaller than ½ of the size of the electronic device 90 in the left-right direction. Also, the size of the stand main body B in the front-back direction may be, for example, smaller than ½ of the size of the electronic device 90 in the front-back direction.

As illustrated in FIG. 1, the stand main body B (upper member 10) has a first supporting surface IIa to make contact with the lower surface of the lower exterior panel 92B and a second supporting surface 11b to make contact with another position of the lower surface of the lower exterior panel 92B. The first supporting surface 11a and the second supporting surface 11b differ in height. (Here, the height refers to a distance from a bottom surface of the stand main body B.) In the example illustrated in FIG. 1, the second supporting surface 11b is higher in position than the first supporting surface 11a. Thus, by providing the supporting surfaces 11a and 11b that differ in height, it is possible to stably support the curved lower exterior panel 92B. In the example of the stand 1, the upper member 10 has a mobile stage 13. An upper surface of the mobile stage 13 constitutes part of an upper surface of the upper member 10. As will be described later, the mobile stage 13 can move up and down around a base end 13a thereof. The second supporting surface 11b is provided on the upper surface of the mobile stage 13.

The supporting surfaces 11a and 11b may be curved to suit the lower surface of the lower exterior panel 92B. That is, the height may vary depending on the position on the supporting surfaces 11a and 11b. The supporting surfaces 11a and 11b may form substantially the same curved surface as that formed by the lower surface of the lower exterior panel 92B. For example, the supporting surfaces 11a and 11b are curved in such a manner as to gradually increase in height toward the back. The two supporting surfaces 11a and 11b may be curved in different manners. That is, the curved surface formed by the first supporting surface 11a may not be the same as the curved surface formed by the second supporting surface 11b. This makes it possible to stably support the lower surface of the lower exterior panel 92B having a complex curved surface.

It should be noted that the number of supporting surfaces possessed by the stand main body B may not be only two and may be three or four. Also, the first supporting surface 11a and the second supporting surface 11b may be connected. That is, the stand main body B (upper member 10) may have, also between the first supporting surface 11a and the second supporting surface 11b, a supporting surface that is in contact with the lower surface of the lower exterior panel 92B and that is curved to suit the lower surface of the lower exterior panel 92B. Further, in an alternative example, only one of the two supporting surfaces 11a and 11b may be curved along the curved surface.

As illustrated in FIG. 1, the supporting surfaces 11a and 11b may include a material different from that of other portions of the upper surface (upper surface of the upper member 10) of the stand main body B. For example, an anti-slip member may be provided on the supporting surfaces 11a and 11b. The upper surface of the stand main body B includes resin such as ABS resin or polycarbonate. Meanwhile, the anti-slip member may include rubber or elastomer.

As illustrated in FIG. 1, the stand main body B (upper member 10) may have auxiliary supporting stages 12A and 12B around the supporting surfaces 11a and 11b. The second supporting surface 11b is located between the two auxiliary supporting stages 12A and 12B. Upper surfaces (auxiliary supporting surfaces) 12a of the auxiliary supporting stages 12A and 12B are sloped in such a manner as to gradually increase in height from a position near the first supporting surface 11a toward a position near the second supporting surface 11b. The auxiliary supporting surfaces 12a may be lower than the second supporting surface 11b. Then, the auxiliary supporting surfaces 12a may not be in contact with the lower surface of the lower exterior panel 92B of the electronic device 90. In this case, when the electronic device 90 tilts on the stand 1, for example, it is possible to support the electronic device 90 by means of the auxiliary supporting surfaces 12a.

As illustrated in FIG. 3, the arm 27 extends from the stand main body B toward an outer edge of the lower exterior panel 92B. An end portion of the arm 27 reaches the outside of the outer edge of the lower exterior panel 92B. The arm 27 has, at the end portion, the engagement sections 27A and 27B (refer to FIG. 1) that engage with the exterior member of the electronic device 90. It is possible to attach the stand 1 to the electronic device 90 by means of the engagement sections 27A and 27B. Because the arm 27 extends toward the outer edge of the lower exterior panel 92B, it is not necessary to provide a structure for fastening the stand main body to the curved exterior surface (lower surface of the lower exterior panel 92B), which makes it possible to improve a degree of freedom in appearance of the electronic device.

As illustrated in FIG. 3, in the example of the stand 1, the arm 27 extends toward the back edge 92a of the lower exterior panel 92B, and the engagement sections 27A and 27B reach the outside of the back edge 92a of the lower exterior panel 92B and engage with the back edge 92a of the lower exterior panel 92B. Accordingly, it is possible to prevent the arm 27 and the engagement sections 27A and 27B from standing out and improve the appearance of the electronic device 90. The arm 27 is, for example, in the shape of a plate that extends backward. The engagement sections 27A and 27B bend upward at a back end of the arm 27.

Figure 2A:
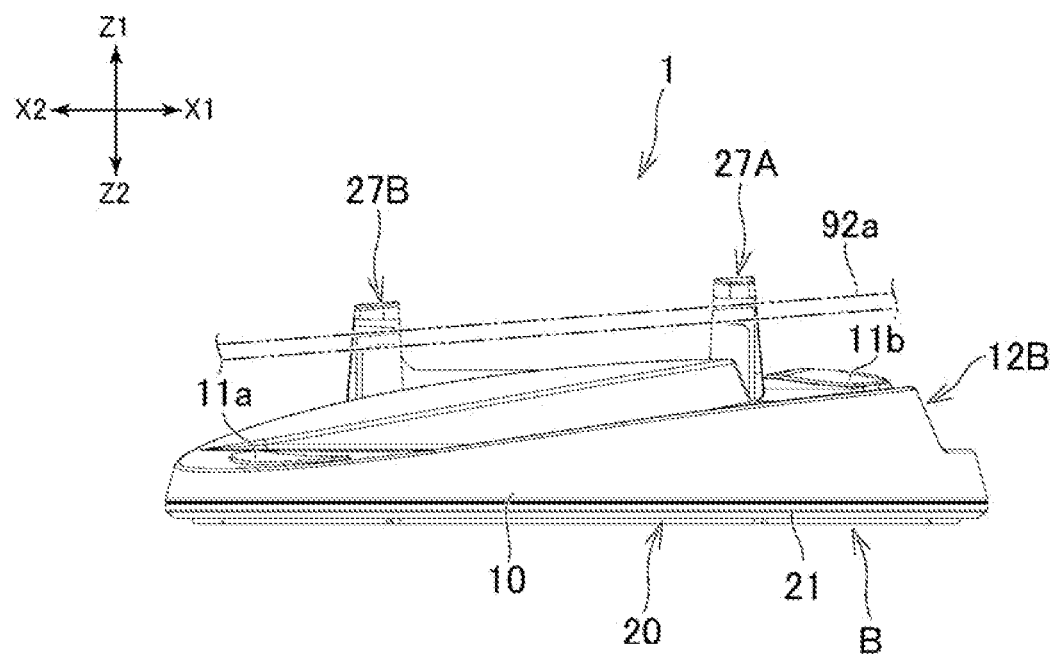
FIG. 2A is a front view of the stand illustrated in FIG. 1.
Figure 2B:
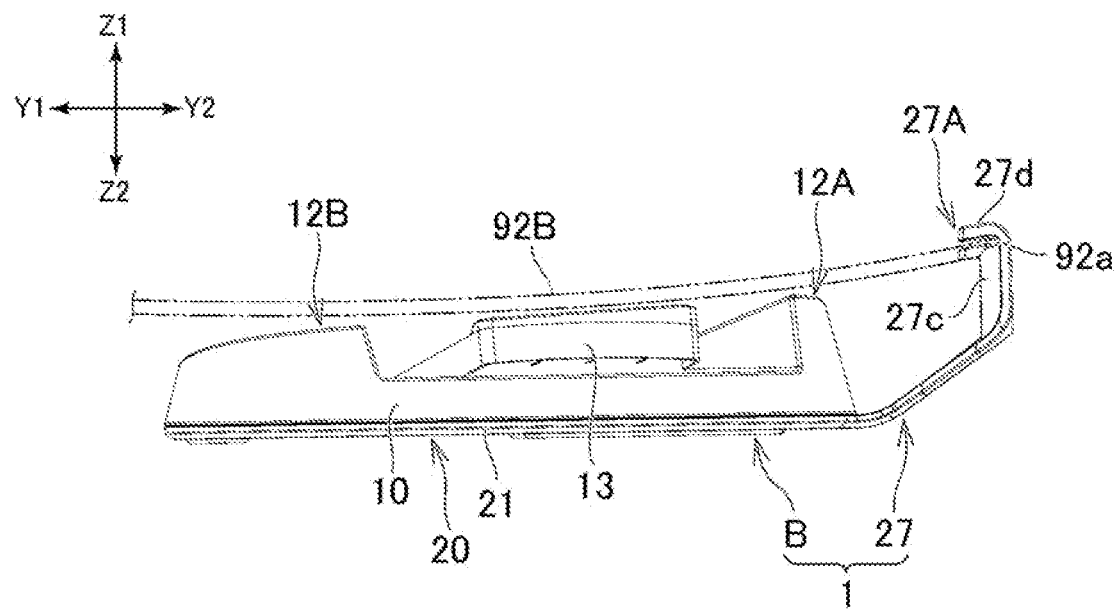
FIG. 2B is a right-side view of the stand illustrated in FIG. 1.

The engagement sections 27A and 27B may be configured, for example, in such a manner that the back edge 92a of the lower exterior panel 92B can be press-fitted. This makes it possible to allow the engagement sections 27A and 27B to hold the back edge 92a by performing an easy task. As illustrated in FIG. 2B, in the example of the stand 1, each of the two engagement sections 27A and 27B has an elastic section 27c and a pinching section 27d. The elastic section 27c includes, for example, an elastic material such as rubber or elastomer. The elastic section 27c and the pinching section 27d face each other in the up-down direction with a small gap provided therebetween. The back edge 92a (refer to FIG. 3) of the lower exterior panel 92B can be press-fitted into the gap. The back edge 92a is held by the engagement sections 27A and 27B by means of an elastic force of the elastic section 27c.

Figure 4:
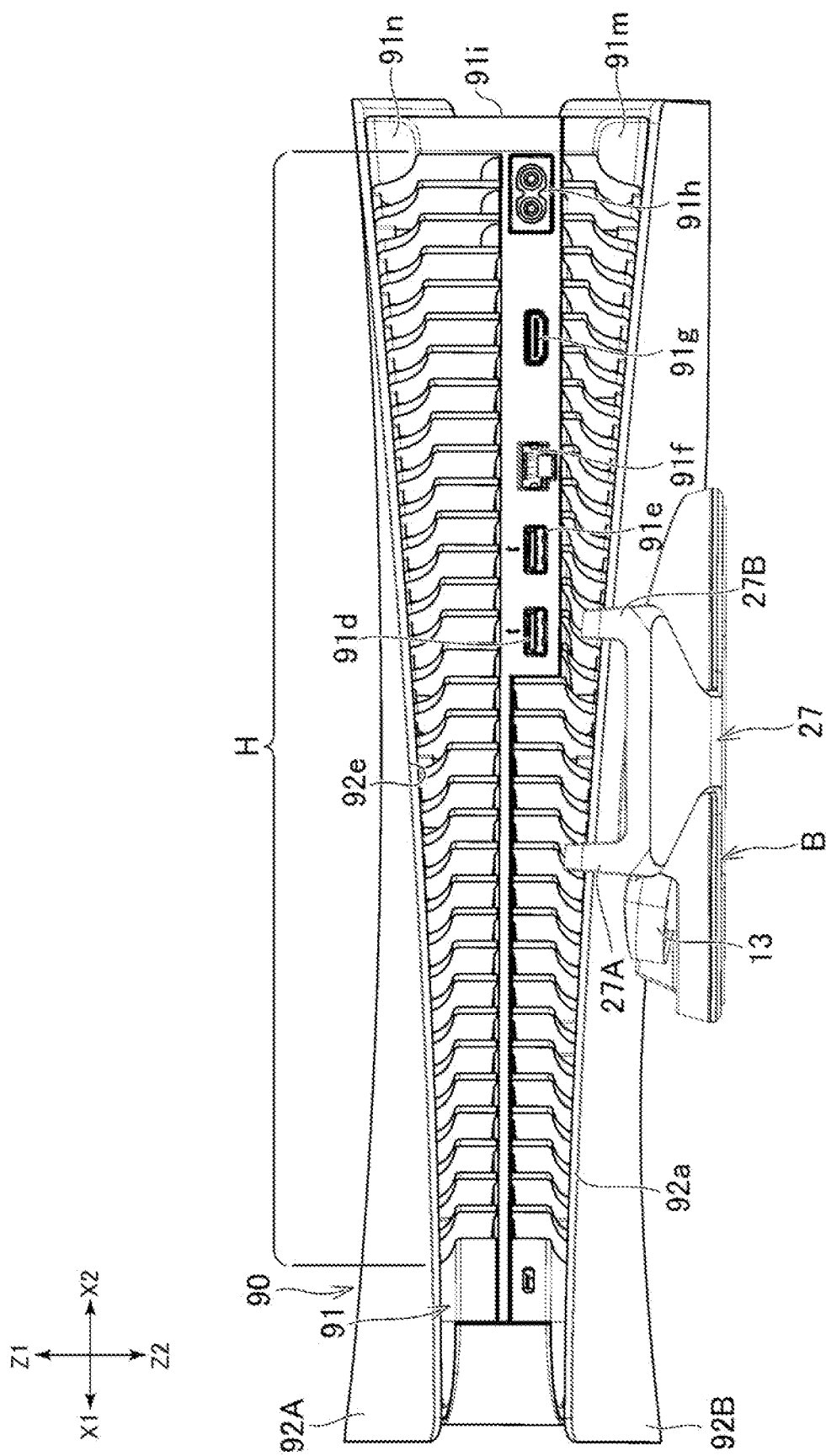
FIG. 4 is a back view of the stand attached to the electronic device in the horizontal posture.

As illustrated in FIG. 4, the electronic device 90 has the exhaust port H in which a plurality of louvers are provided. The exhaust port H is formed between a back edge 92e of the upper exterior panel 92A and the back edge 92a of the lower exterior panel 92B. Because the engagement sections 27A and 27B engage with the back edge 92a of the lower exterior panel 92B, the engagement sections 27A and 27B and the exhaust port H substantially do not overlap in back view. This makes it possible to suppress the engagement sections 27A and 27B becoming exhaust resistance.

As illustrated in FIG. 4, the arm 27 has the two engagement sections 27A and 27B that differ in height. Here, the heights of the engagement sections 27A and 27B refer to the distances from a plane including the bottom surface of the stand 1 to the respective gaps between the elastic sections 27c and the pinching sections 27d. The height of the back edge 92a of the lower exterior panel 92B varies in an extension direction thereof. In the example of the electronic device 90, the back edge 92a gradually descends from a right end to a left end. The height of each of the two engagement sections 27A and 27B conforms to the height of the back edge 92a at the position where that engagement section engages. In consequence, when the electronic device 90 is arranged on the stand main body B (refer to FIG. 1) and the back edge 92a of the lower exterior panel 92B is brought into engagement with the engagement sections 27A and 27B, the position of the stand 1 with respect to the lower surface of the lower exterior panel 92B is determined. In other words, if the stand 1 is deviated from a proper position determined in advance with respect to the lower surface of the lower exterior panel 92B, the height of the back edge 92a of the lower exterior panel 92B does not match the heights of the engagement sections 27A and 27B (heights of the gaps between the elastic sections 27c and the pinching sections 27d), which makes it impossible to cause them to engage with each other. In the example of the stand 1, the position of the stand 1 determined by the engagement sections 27A and 27B is a center of the electronic device 90 in the left-right direction.

The structures of the engagement sections 27A and 27B are not limited to those in the example of the stand 1. For example, the number of engagement sections possessed by the stand 1 may be one. In this case, the stand 1 may have a single engagement section that continues from the position of the one engagement section 27A to the position of the other engagement section 27B. In this case, too, the height of one portion of the single engagement section (first engagement section) and the height of another portion of the single engagement section (second engagement section) may be different to suit the height of an engaged section (back edge 92a of the lower exterior panel 92B) of the electronic device 90.

Figure 9:
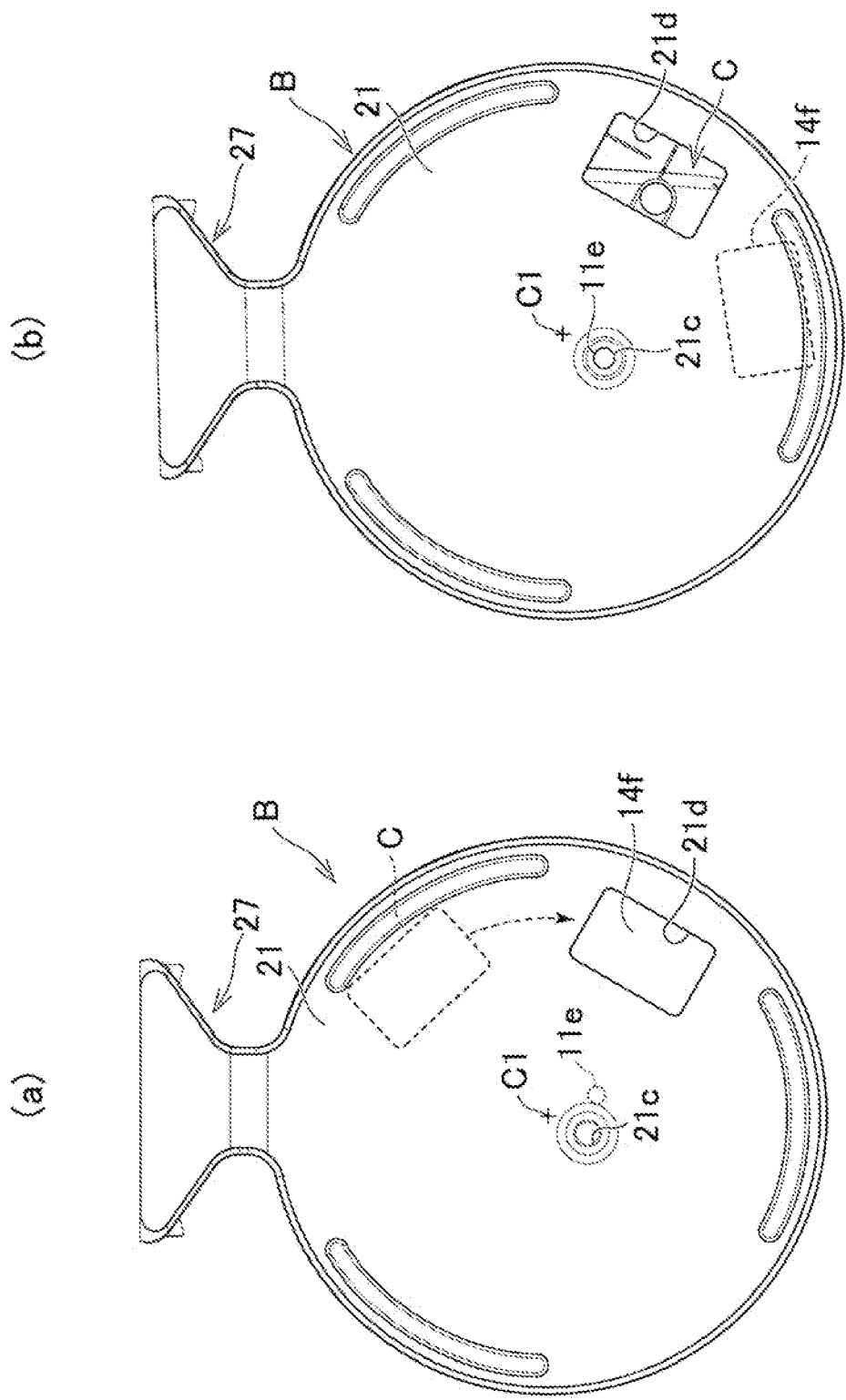
FIG. 9 depicts diagrams illustrating a bottom surface of the stand. In these diagrams, the stand is in the horizontal supporting state in (a) and is in the vertical supporting state in (b).

As illustrated in FIGS. 1 and 5, the bottom portion 21 (refer to FIG. 7) of the lower member 20 and the upper member 10 are rotatable relative to each other around a center C1 (refer to FIG. 9). The upper member 10 and the bottom portion 21 of the lower member 20 are circular in plan view. An outer circumferential edge of the upper member 10 and an outer circumferential edge of the bottom portion 21 are circumferentially slidable. Relative rotation of the lower member 20 and the upper member 10 changes relative positions of the upper surface of the stand main body B (more specifically, the supporting surfaces 11a and 11b) and the engagement sections 27A and 27B.

In the example of the stand 1, assuming that a direction in which the engagement sections 27A and 27B are located with respect to the center C1 of the stand main body B is backward when the upper member 10 and the lower member 20 are at the horizontal supporting positions as illustrated in FIG. 3, the first supporting surface 11a and the second supporting surface 11b are arranged side by side diagonally with respect to the front-back direction. As a result, the supporting surfaces 11a and 11b come in contact with the lower surface of the lower exterior panel 92B, which makes it possible for the engagement sections 27A and 27B to engage with the back edge 92a of the lower exterior panel 92B.

Meanwhile, assuming that the direction in which the engagement sections 27A and 27B are located with respect to the center C1 of the stand main body B is backward when the upper member 10 and the lower member 20 are at the vertical supporting positions as illustrated in FIG. 5, the first supporting surface 11a and the second supporting surface 11b are arranged side by side in the front-back direction. As a result, the electronic device 90 is arranged between the auxiliary supporting stages 12A and 12B of the upper member 10 as illustrated in FIG. 6, which makes it possible to arrange the engagement sections 27A and 27B on a back side of the electronic device 90. At this time, the engagement sections 27A and 27B may be arranged at recessed portions 91m and 91n (refer to FIG. 4), respectively, that are formed in the back surface of the electronic device 90. That is, in the example of the stand 1, the two engagement sections 27A and 27B are formed apart in the left-right direction to be at the positions of the recessed portions 91m and 91n. This makes it possible to reduce the size of the electronic device assembly that includes the engagement sections 27A and 27B and the electronic device 90, in the front-back direction.

Figure 8:
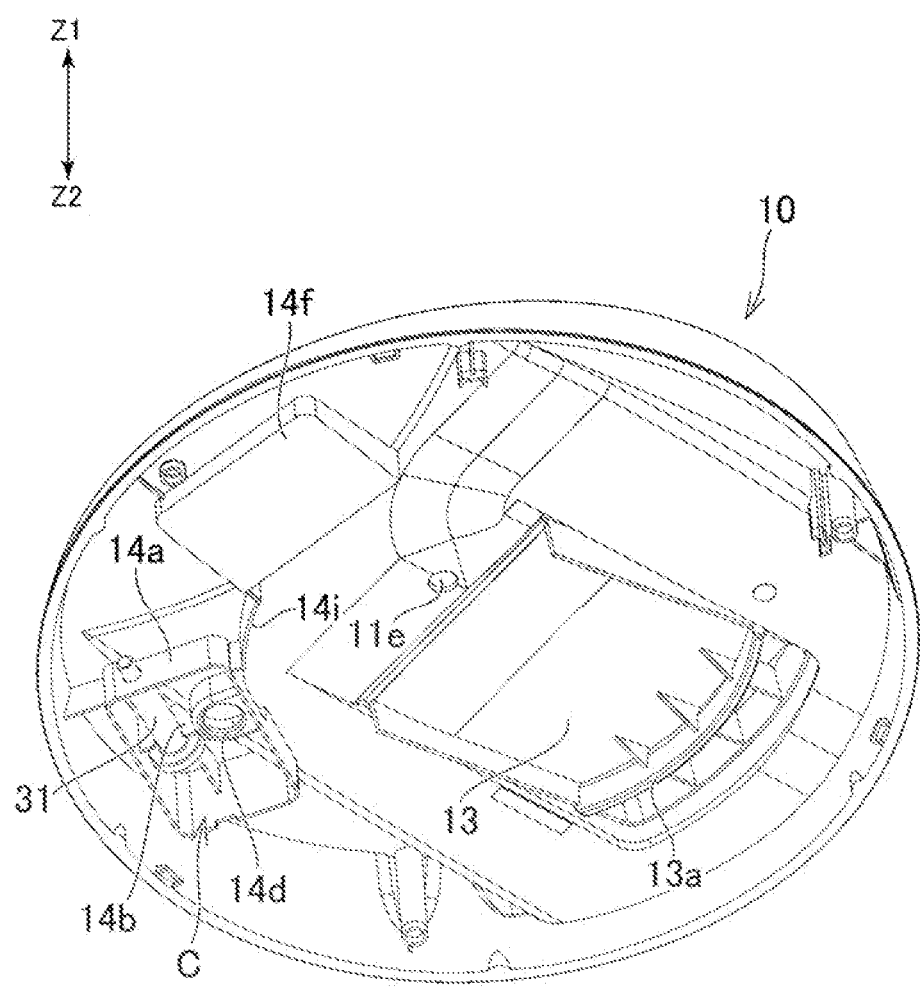
FIG. 8 is a perspective view illustrating an inside (lower side) of an upper member of the stand.

As described above, the upper member 10 has the mobile stage 13 (refer to FIG. 1). The base end 13a of the mobile stage 13 is connected to another portion of the upper member 10, which makes it possible for the mobile stage 13 to move up and down around the base end 13a. As illustrated in FIG. 7, a supporting stage 21a is formed on the bottom portion 21 of the lower member 20. The supporting stage 21a corresponds in position to the mobile stage 13 when the upper member 10 and the lower member 20 are at the horizontal supporting positions. Accordingly, the arrangement of the upper member 10 and the lower member 20 at the horizontal supporting positions causes the mobile stage 13 to run up onto the supporting stage 21a and tilt as illustrated in FIG. 1. As a result, the second supporting surface 11b formed on the mobile stage 13 rises in position, which causes the second supporting surface 11b to support the lower surface of the lower exterior panel 92B. A slope 21b for guiding the mobile stage 13 may be formed on the supporting stage 21a. As illustrated in FIG. 8, a guided wall 13a that slides on the supporting stage 21a may be formed on a lower surface of the mobile stage 13. This reduces friction between the supporting stage 21a and the mobile stage 13, which makes it possible for the mobile stage 13 to move smoothly on the supporting stage 21a.

Meanwhile, when the upper member 10 and the lower member 20 are at the vertical supporting positions, the mobile stage 13 is separated from the supporting stage 21a and arranged horizontally as illustrated in FIG. 5. As a result, the second supporting surface 11b formed on the mobile stage 13 lowers in position. Then, it becomes possible to arrange the electronic device 90 in the vertical posture between the auxiliary supporting stages 12A and 12B. It should be noted that the structure of the mobile stage (mobile section) 13 is not limited to that in the example of the stand 1. For example, the stand 1 may have a mobile section that changes not only the height of the second supporting surface 11b but also the height of the first supporting surface 11a.

The stand 1 in the vertical supporting state may be fastened to the electronic device 90 by a fixture 31 (refer to FIG. 5). The fixture 31 is, for example, a screw. A hole 21c (refer to FIG. 7) into which the fixture 31 is inserted is formed in the bottom portion 21 of the lower member 20. A hole 11e (refer to FIG. 8) through which the fixture 31 passes is formed also in the upper member 10. The fixture 31 is inserted into the holes 21c and 11e from the lower side of the bottom portion 21 of the lower member 20 and projects upward from the upper surface of the upper member 10 as illustrated in FIG. 5. A hole (threaded hole) in which the fixture 31 is fastened is formed in the left side surface 91i of the electronic device 90. The use of the fixture 31 in this manner makes it possible to mount the stand 1 firmly to the electronic device 90.

As illustrated in FIG. 9, positions of the holes 21c and 11e are deviated from the rotational center C1 of the upper member 10 and the lower member 20. When the relative positions of the upper member 10 and the lower member 20 are at the horizontal supporting positions, the positions of the two holes 21c and 11e are deviated from each other as illustrated in (a) of FIG. 9. This makes it possible to prevent erroneous use of the fixture 31. When the relative positions of the upper member 10 and the lower member 20 are at the vertical supporting positions, the positions of the two holes 21c and 11e match as illustrated in (b) of FIG. 9. This makes it possible to fit the fixture 31 into the two holes 21c and 11e.

A holding section for temporarily holding the fixture 31 may be formed inside the stand main body B. This makes it possible to prevent loss of the fixture 31. In the example of the stand 1, a storage chamber C is formed on the inside of the upper member 10 as illustrated in FIG. 8. A wall section 14a and a wall section 14b are formed in the storage chamber C. A hole into which an end portion of the fixture 31 is inserted is formed in the wall section 14a. A recessed portion for holding a base portion of the fixture 31 is formed in the wall section 14b. These wall sections 14a and 14b function as the holding section for the fixture 31. A projecting portion 21h (refer to FIG. 7) that abuts against the fixture 31 and prevents rattling of the fixture 31 may be formed in the bottom portion 21 of the lower member 20.

A storage chamber opening 21d (refer to FIG. 7) for exposing the storage chamber C is formed in the bottom portion 21 of the lower member 20. When the relative positions of the upper member 10 and the lower member 20 are at the vertical supporting positions as illustrated in (b) of FIG. 9, the storage chamber C formed in the upper member 10 and the storage chamber opening 21d coincide with each other in position. Meanwhile, when the relative positions of the upper member 10 and the lower member 20 are at the horizontal supporting positions, the position of the storage chamber C formed in the upper member 10 is separated from the storage chamber opening 21d as illustrated in (a) of FIG. 9. That is, the fixture 31 can be taken out from the storage chamber C only when used.

The electronic device 90 may have a cap that covers a hole (threaded hole) for the fixture 31 formed on the left side surface (not illustrated) thereof. A cap holding section 14d for holding the cap may be locked to the storage chamber C formed in the upper member 10 as illustrated in FIG. 8. The cap holding section 14d may be, for example, a hole into which the cap is fitted.

As illustrated in FIG. 8, the upper member 10 may have a closing section 14f therein. When the upper member 10 and the lower member 20 are at the horizontal supporting positions as illustrated in (a) of FIG. 9, the storage chamber opening 21d formed in the bottom portion 21 of the lower member 20 and the closing section 14f coincide with each other in position, which causes the closing section 14f to block the storage chamber opening 21d. This makes it possible to prevent foreign objects from entering into the stand main body B through the storage chamber opening 21d. The upper member 10 further has the wall section 14a and a wall section 14i therein. These wall sections 14a and 14i and a side surface of the closing section 14f surround a region that is exposed through the storage chamber opening 21d in the course of the relative rotation of the upper member 10 and the bottom portion 21 of the lower member 20. This makes it possible to prevent foreign objects that have entered through the storage chamber opening 21d from finding their way deeply into the stand main body B.

The stand 1 described above has the mobile stage 13 that moves up and down to suit the variation of the relative positions of the upper member 10 and the lower member 20, and the second supporting surface 11b is formed on the mobile stage 13. The stand may not have such a mobile stage (mobile section) depending on the curvature of the exterior surface of the electronic device 90. FIGS. 11A to FIG. 13 are diagrams illustrating an example of such a stand. A description will be given below with focus on differences between a stand 101 illustrated in these diagrams and the stand 1 described above. Matters that are not described regarding the stand 101 may be similar to those of the stand 1.

Figure 11A:
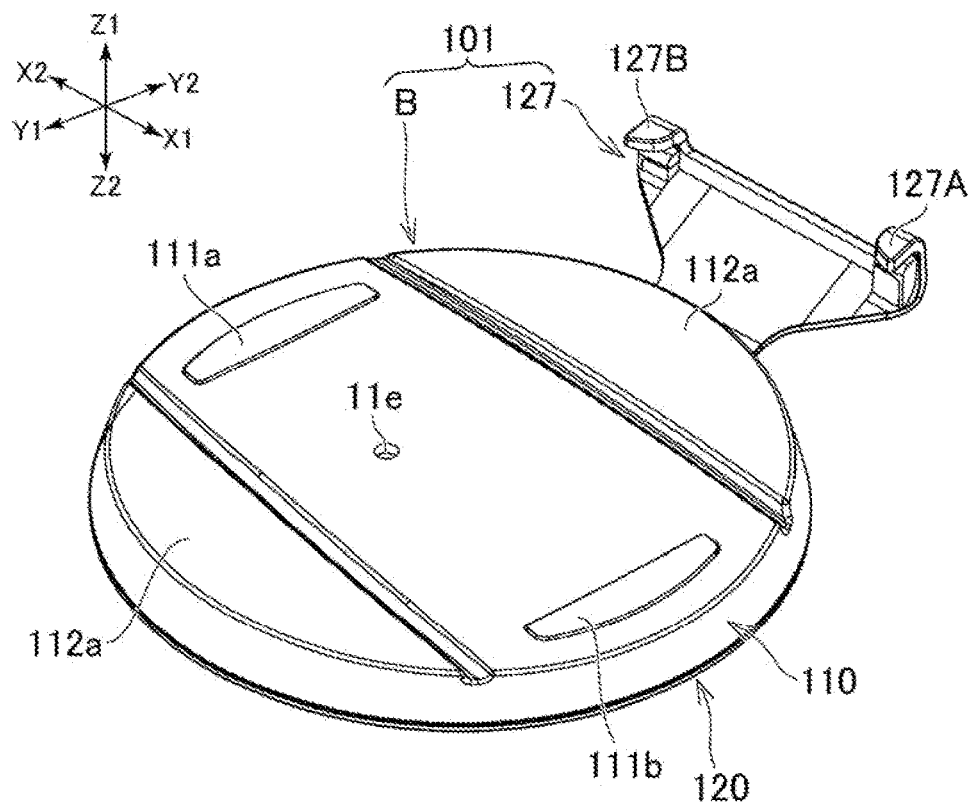
FIG. 11A is a perspective view illustrating another example of the stand proposed in the present disclosure. In this diagram, the stand is in a state for supporting an electronic device in the horizontal posture (horizontal supporting state).
Figure 11B:
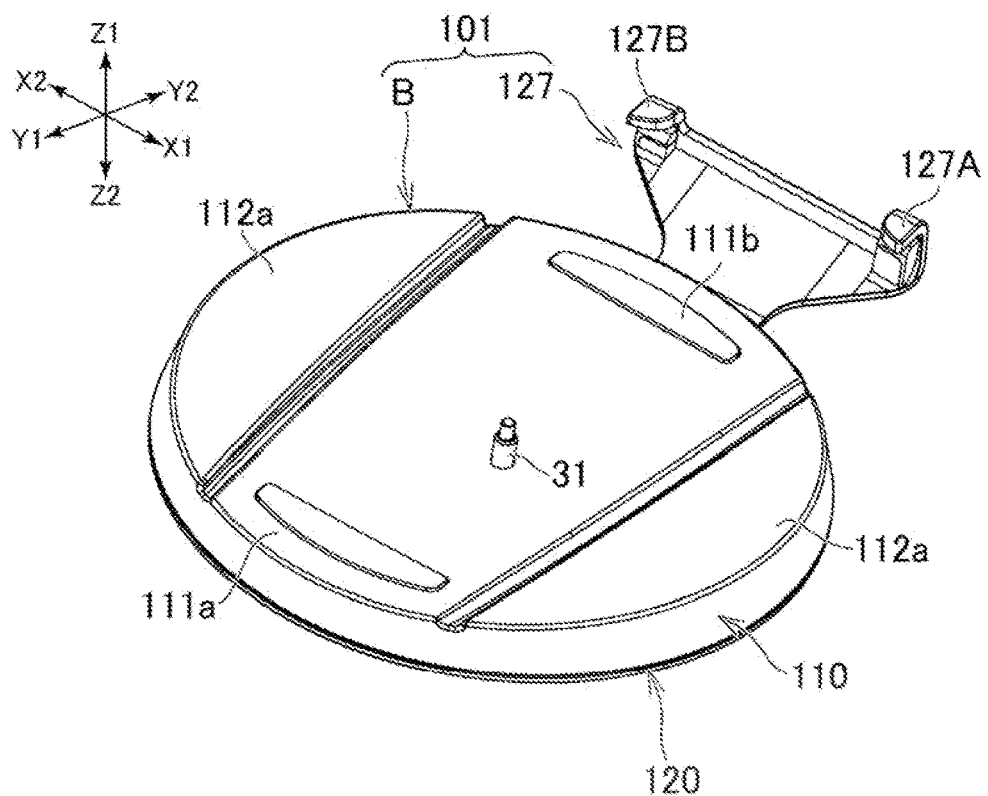
FIG. 11B is a perspective view of the stand illustrated in FIG. 11A. In this diagram, the stand is in a state for supporting an electronic device in the vertical posture (vertical supporting state).

As illustrated in FIG. 11A and FIG. 11B, the stand 101 has the stand main body B and an arm 127. The arm 127 extends from the stand main body B toward an outer edge of a lower exterior panel 192B. Engagement sections 127A and 127B are formed on the arm 127. The engagement sections 127A and 127B engage with an exterior member of an electronic device 190. In the example of the stand 101, the arm 127 extends toward a back edge 192a of the lower exterior panel 192B as in the stand 1 described above, and the engagement sections 127A and 127B engage with the back edge 92a of the lower exterior panel 92B.

As illustrated in FIG. 11A, the stand 101 has an upper member 110 and a lower member 120 that are assembled together in the up-down direction. A first supporting surface 111a and a second supporting surface 111b are formed on an upper surface of the upper member 10. The lower exterior panel 192B of the electronic device 190 to which the stand 101 is mounted is curved in a manner different from that of the lower exterior panel 92B of the electronic device 90 and is, for example, less undulated than the lower exterior panel 92B. Accordingly, in the example of the stand 101, the upper member 110 has no mobile stage that can move up and down. Heights of the two supporting surfaces 111a and 111b may be substantially the same.

The supporting surfaces 111a and 111b may be curved to suit a lower surface of the lower exterior panel 192B. Anti-slip members may be provided on the supporting surfaces 111a and 111b. The stand main body B (upper member 110) has auxiliary supporting surfaces 112a around the supporting surfaces 111a and 111b. The supporting surfaces 111a and 111b are located between the two auxiliary supporting surfaces 112a. The auxiliary supporting surfaces 112a may also be curved to suit the lower surface of the lower exterior panel 192B.

Figure 12:
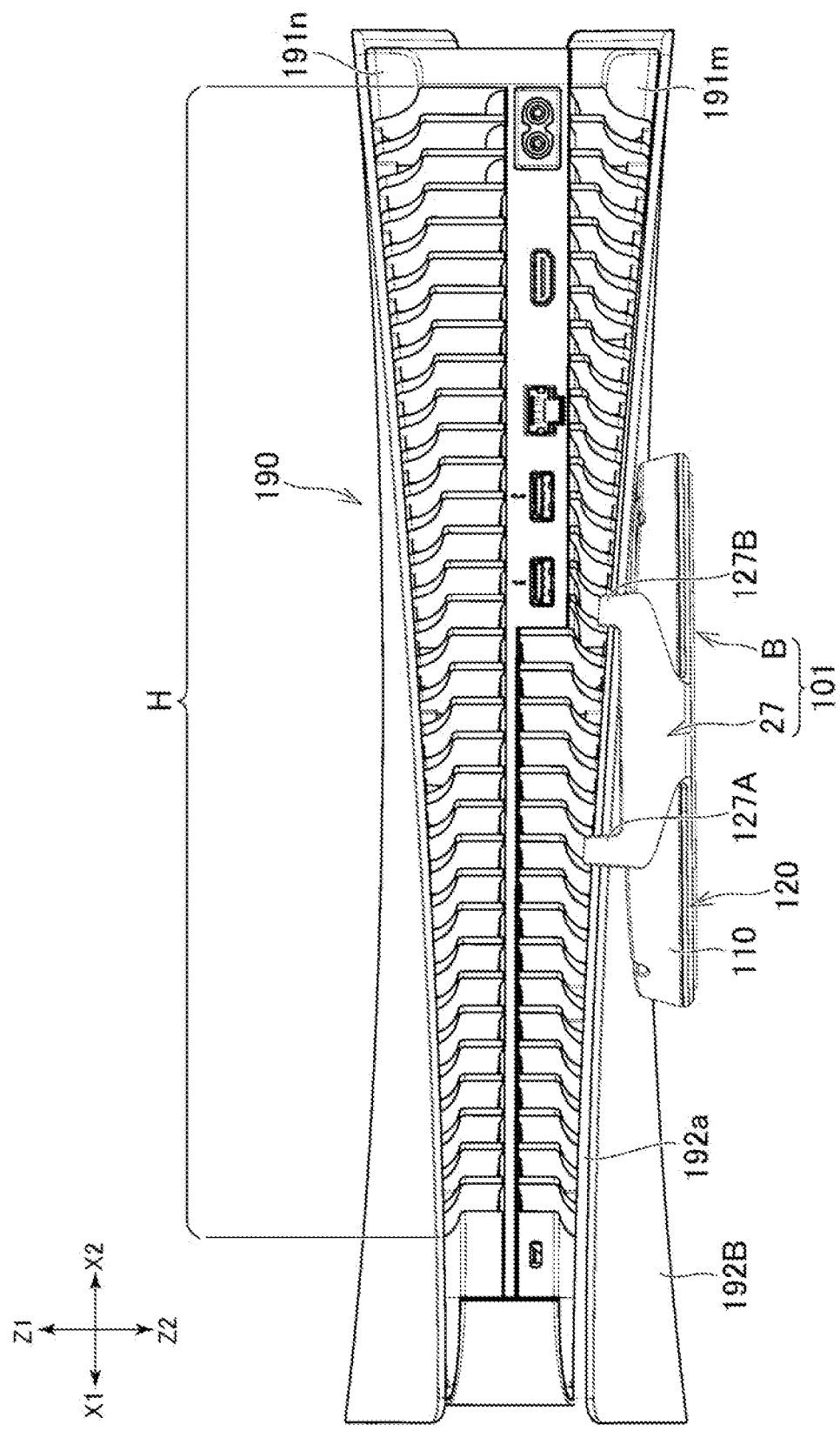
FIG. 12 is a back view of the stand attached to the electronic device in the horizontal posture.
Figure 13:
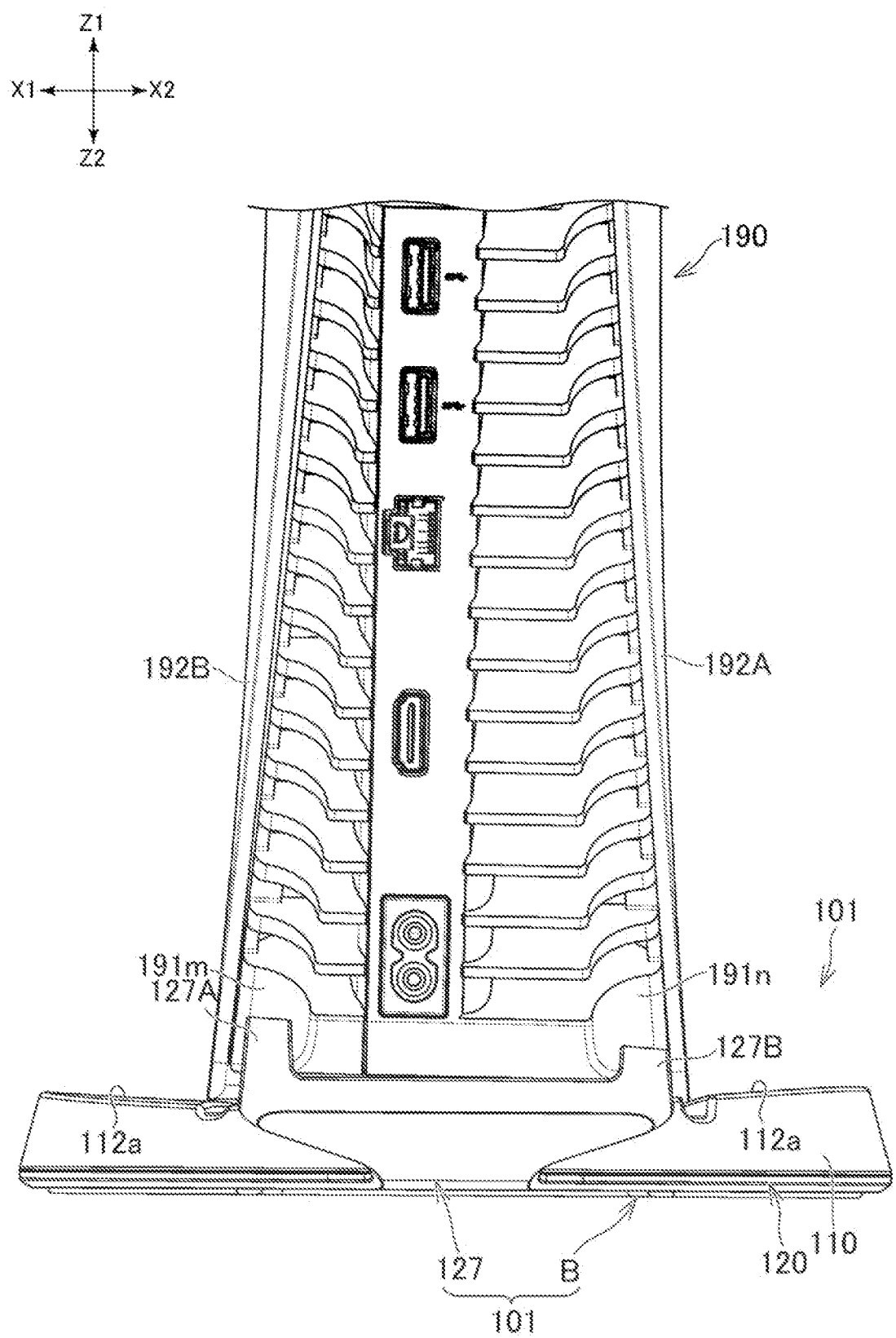
FIG. 13 is a back view of the stand attached to the electronic device in the vertical posture.

The upper member 110 and the lower member 120 are rotatable relative to each other and are selectively arranged at the horizontal supporting positions and the vertical supporting positions. Assuming that a direction in which the engagement sections 127A and 127B are located with respect to the center of the stand main body B is backward when the upper member 110 and the lower member 120 are at the horizontal supporting positions as illustrated in FIG. 11A, the first supporting surface 111a and the second supporting surface 111b are arranged side by side in the left-right direction. As a result, the first supporting surface 111a and the second supporting surface 111b come in contact with the lower surface of the lower exterior panel 92B as illustrated in FIG. 12, which makes it possible for the engagement sections 27A and 27B to engage with the back edge 92a of the lower exterior panel 92B.

Meanwhile, assuming that the direction in which the engagement sections 127A and 127B are located with respect to the center C1 of the stand main body B is backward when the upper member 110 and the lower member 120 are at the vertical supporting positions as illustrated in FIG. 11B, the first supporting surface 111a and the second supporting surface 111b are arranged side by side in the front-back direction. As a result, the electronic device 190 is arranged between the first and second supporting surfaces 111a and 111b of the upper member 10, which makes it possible to arrange the engagement sections 127A and 127B on the back side of the electronic device 190. At this time, the engagement sections 127A and 127B may be arranged at recessed portions 191m and 191n (refer to FIG. 13), respectively, that are formed in a back surface of the electronic device 190. The stand 101 may be fastened to the electronic device 190 in the vertical posture by the fixture 31 as with the stand 1.

As described above, the stands 1 and 101 are stands for supporting the electronic devices 90 and 190 having the lower exterior panels 92B and 192B with curved lower surfaces. The stands 1 and 101 have the stand main bodies B. The stand main bodies B are located, in plan view, inside the outer circumferential edges of the lower exterior panels 92B and 192B and have the supporting surfaces 11a and 11b and the supporting surfaces 111a and 111c to be brought into contact with the lower surfaces. Also, the arms 27 and 127 of the stands 1 and 101 extend from the stand main bodies B toward the outer edges of the lower exterior panel 92B of the electronic device 1 and 101 and have the engagement sections 27A and 27B and the engagement sections 127A and 127B (FIG. 3, FIG. 4, FIG. 11A, and FIG. 11B) that engage with the exterior members of the electronic devices 90 and 190. Thus, because the stand main bodies B are located inside the outer circumferential edges of the lower exterior panels 92B and 192B, it is possible to prevent the stand main bodies B from standing out and improve the appearances of the electronic devices 90 and 190 when the electronic devices 90 and 190 is arranged in the horizontal posture. Also, because the arms 27 and 127 extend toward the outer edges of the lower exterior panels 92B and 192B, it is not necessary to provide a structure for fastening the stand main bodies to the curved exterior surfaces (lower surfaces of the lower exterior panels 92B and 192B), which makes it possible to improve the degree of freedom in appearance of the electronic devices.

It should be noted that the stand proposed in the present disclosure is not limited to the examples of the stands 1 and 101 described above. For example, the upper members 10 and 110 and the bottom portions 21 of the lower members 20 and 120 may not be rotatable relative to each other. For example, in order to avoid interference between the electronic devices in the vertical posture and the arms 27 and 127, the arms 27 and 127 may be movable relative to the stand main bodies B. Further, the arms 27 and 127 and the mobile stage 13 provided on the upper member 10 may move in a coordinated manner.

The invention claimed is:

1. A stand for supporting an electronic device having a curved first exterior surface, the stand comprising:
   a stand main body that is located in plan view inside an outer circumferential edge of the first exterior surface and that has a first supporting surface to make contact with the first exterior surface; and
   an arm that extends from the stand main body toward the outer circumferential edge of the first exterior surface of the electronic device and that has an engagement section to engage with an exterior member of the electronic device,
   wherein the engagement section of the arm includes a first portion and a second portion, the first portion forming a first concaved edge receiving element and the second portion forming a second concaved edge receiving element spaced laterally away from the first concaved edge receiving element, and each of the first concaved edge receiving element and the second concaved edge receiving element engaging a respective portion of a peripheral edge of the curved first exterior surface of the electronic device.

2. The stand according to claim 1, wherein
   the exterior member of the electronic device is a panel having the first exterior surface, and
   the engagement section is formed in such a manner as to hold an edge of the panel.

3. The stand according to claim 1, wherein the arm extends toward a back side of the electronic device.

4. The stand according to claim 3, wherein
   the electronic device has an exhaust port on the back side thereof, and
   the engagement section is formed in such a manner as to avoid a position of the exhaust port.

5. The stand according to claim 1, wherein the first portion and the second portion differ in height in order to conform to the exterior member of the electronic device.

6. The stand according to claim 1, wherein the stand main body has a second supporting surface that differs in height from the first supporting surface to make contact with the first exterior surface.

7. The stand according to claim 6, wherein at least one of the first supporting surface and the second supporting surface is curved.

8. The stand according to claim 6, wherein the first supporting surface and the second supporting surface each include a material different from that of other portions of the upper surface of the stand main body.

9. The stand according to claim 1, wherein
   the electronic device has the first exterior surface that faces a first direction and a second exterior surface that faces a second direction intersecting the first direction,
   the stand can be set to a first supporting state in which the stand main body is capable of supporting the first exterior surface and a second supporting state in which the stand main body is capable of supporting the second exterior surface,
   the stand has a mobile section having the first supporting surface, and
   a position of the mobile section in the first supporting state is different from a position of the mobile section in the second supporting state.

10. The stand according to claim 9, wherein a height of the mobile section in the first supporting state is different from a height of the mobile section in the second supporting state.

11. The stand according to claim 1, wherein
   the electronic device has the first exterior surface that faces a first direction and a second exterior surface that faces a second direction intersecting the first direction,
   the stand can be set to a first supporting state in which the stand main body is capable of supporting the first exterior surface and a second supporting state in which the stand main body is capable of supporting the second exterior surface, and
   relative positions of the first supporting surface and the engagement section in the first supporting state are different from relative positions of the first supporting surface and the engagement section in the second supporting state.

12. The stand according to claim 11, comprising:
   an upper member having the first supporting surface; and
   a lower member assembled with the upper member,
   wherein relative positions of the upper member and the lower member in the first supporting state are different from relative positions of the upper member and the lower member in the second supporting state.

13. The stand according to claim 12, wherein
a hole into which a fixture for fastening the stand to the second exterior surface of the electronic device is inserted is formed in each of the upper member and the lower member, and
a position of the hole in the upper member and a position of the hole in the lower member coincide with each other when the stand is in the second supporting state, and the position of the hole in the upper member and the position of the hole in the lower member are deviated from each other when the stand is in the first supporting state.

14. An electronic device assembly comprising:
an electronic device having a curved first exterior surface; and
a stand for supporting the electronic device, wherein the stand has
a stand main body that is located in plan view inside an outer circumferential edge of the first exterior surface and that has a first supporting surface to make contact with the first exterior surface, and
an arm that extends from the stand main body toward the outer circumferential edge of the first exterior surface of the electronic device and that has an engagement section to engage with an exterior member of the electronic device,
wherein the engagement section of the arm includes a first portion and a second portion, the first portion forming a first concaved edge receiving element and the second portion forming a second concaved edge receiving element spaced laterally away from the first concaved edge receiving element, and each of the first concaved edge receiving element and the second concaved edge receiving element engaging a respective portion of the outer circumferential edge of the curved first exterior surface of the electronic device.

* * * * *